(12) United States Patent  
Shiratake (10) Patent No.: US 6,531,757 B2
(45) Date of Patent: Mar. 11, 2003

(54) SEMICONDUCTOR DEVICE FUSE BOX WITH FUSES OF UNIFORM DEPTH

(75) Inventor: Shigeru Shiratake, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/993,954

(22) Filed: Nov. 27, 2001

(65) Prior Publication Data

US 2002/0063306 A1 May 30, 2002

(30) Foreign Application Priority Data

Nov. 27, 2000 (JP) ........................................ 2000-359248

(51) Int. Cl.⁷ .............................................. H01L 29/00
(52) U.S. Cl. ....................... 257/529; 257/665; 257/910; 102/202.4; 361/275.1; 438/132; 438/215; 438/281
(58) Field of Search ................................ 257/173, 529, 257/665, 910, 209; 102/202.4; 361/275.1; 438/128, 129, 132, 215, 281, 333, 467, 601, 902

(56) References Cited

U.S. PATENT DOCUMENTS 5,731,624 A * 3/1998 Motsiff et al. ............... 257/529
6,291,331 B1 * 9/2001 Wang et al. ................. 438/618
6,351,019 B1 * 2/2002 DeBrosse et al. ........... 257/510

FOREIGN PATENT DOCUMENTS

JP 4-129249 4/1992
JP 10-150164 6/1998

* cited by examiner

Primary Examiner—Nathan J. Flynn
Assistant Examiner—Scott R Wilson
(74) Attorney, Agent, or Firm—McDermott, Will & Emery (57) ABSTRACT

A semiconductor device with a fuse box includes at least two gate electrodes 8, 9 and a fuse member 6. The two gate electrodes 8, 9 are formed on at least one insulating film 13 on a semiconductor substrate 100. The fuse member 6 is formed on the insulating film 13 on the semiconductor substrate 100. The two gate electrodes 8, 9 are electrically connected each other by the fuse member 6. In addition, the insulating film 13 and a field region 2 constituted by a semiconductor region are arranged adjacent to each other in a frame-like guard ring 1. The guard ring 1 is constituted by a semiconductor region formed on the semiconductor substrate 100.

6 Claims, 13 Drawing Sheets

SEMICONDUCTOR DEVICE FUSE BOX WITH FUSES OF UNIFORM DEPTH

BACKGROUND OF THE INVENTION

1. Field of the Invention

The present invention relates to a semiconductor device with a fuse box and a method of manufacturing the same and, in particular, to a semiconductor device with a fuse box having a fuse member consisting of a metal which can be cut by a laser beam and a method of manufacturing the same.

2. Description of the Background Art

Generally, in a semiconductor storage device such as a DRAM (Dynamic Random Access Memory), a fuse member is arranged on a circuit for replacing a redundant circuit for compensating for a defect of a memory cell generated by manufacturing steps or the like. The fuse member arranged in the circuit of the memory cell in which the defect is detected is cut by a laser beam or the like to replace the memory cell with the redundant circuit. In addition, the fuse member may be arranged to adjust an internal voltage in the circuit.

Figure 17:
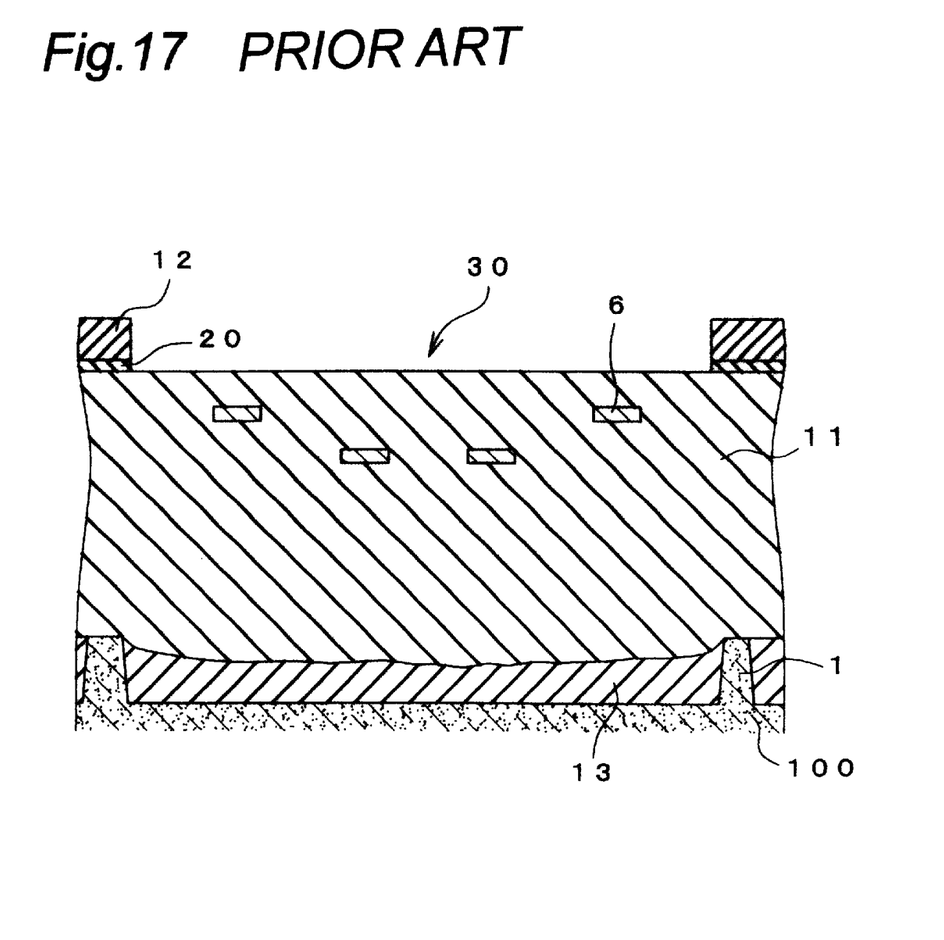
FIG. 17 is a sectional view along a D–D' line in FIG. 16.

The fuse members, in general, are binded and arranged in one fuse box with respect to the management of the fuse members. For example, the fuse box, as shown in FIG. 17, has a plurality of fuse members for electrically connecting gate electrodes formed on an oxide film 13 for element isolation. As the oxide film 13 for element isolation, a LOCOS or a trench is generally used. In order to arrange a fuse box on the oxide film 13, a trench having a flat upper portion, in particular, shallow trench isolation (STI) is most generally used. However, further flattening is necessary, and advanced flattening by a CMP (Chemical Mechanical Polishing) method is performed. At present, an improvement in technique for the CMP process is advanced.

Figure 18:
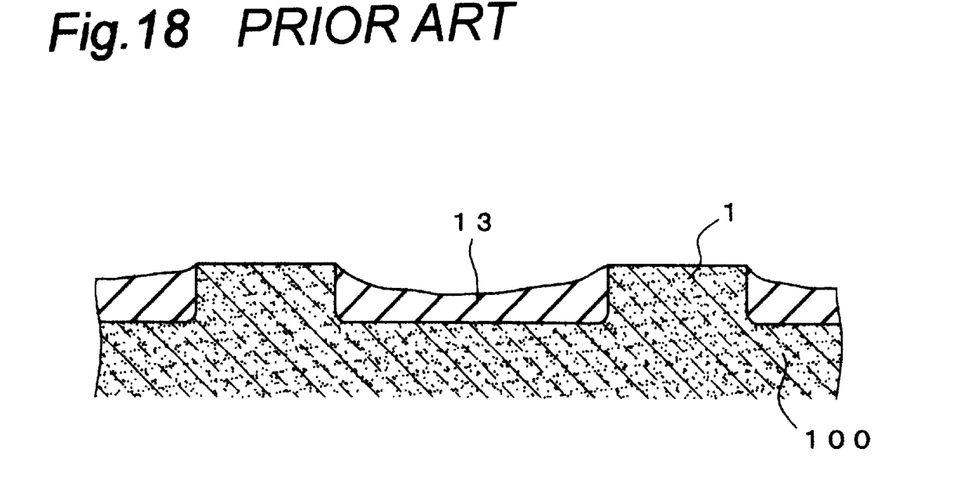
FIG. 18 is a sectional view showing the generation of a dishing in flattening of the oxide film before the gate electrode is formed in the step in manufacturing the fuse box of the prior art semiconductor device.
Figure 19:
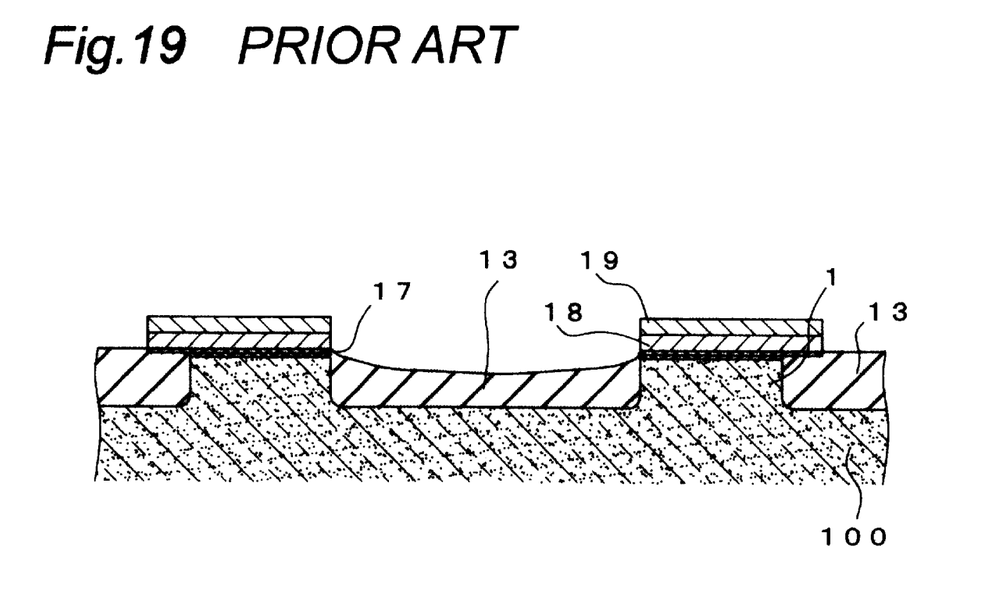
FIG. 19 is a sectional view of the formation of the gate electrode in the step in manufacturing the fuse box of the prior art semiconductor device.

When an element isolation oxide film is flattened by improving the CMP process, a large dishing (that is dented shape) may be generated in a large-area element isolation oxide film. The large dishing is considered to be generated by a compressional difference between portions of an isolation pattern. When a fuse box is laid out on a large isolation pattern, as shown in the sectional view of FIG. 18, a large dishing may be generated on the large isolation pattern. Since the central portion of the large isolation pattern is dished with respect to the end portion, of a large number of fuse members arranged on the isolation pattern, fuse members arranged at the central portion and fuse members arranged at the end portion are different in level. For this reason, when the fuse members are to be cut by a laser beam focused on a predetermined focal point, the laser beam cannot be precisely focused on the fuse members having different levels. Therefore, the fuse members may be unreliably cut.

On the other hand, when a large dishing is generated in an oxide film, the oxide film falls at the end portion of the isolation pattern to expose the edge portion of the silicon substrate. When a gate oxide film and a gate electrode are formed on the oxide film in this order, it is known that the gate oxide film has the thickness at the edge portion smaller than the thickness at the other portion. In this gate insulating film, insulating breakdown may occur because dielectric strength is degraded at a portion where the thickness is small around the edge portion. The thickness of the gate oxide film is reduced with micropatterning of a wiring layer or the like. The reduction in thickness at the edge portion is advanced, and occurrence of insulating breakdown become serious.

SUMMARY OF THE INVENTION

Therefore, it is the first object of the present invention to provide a semiconductor device having a fuse box in which a fuse member for electrically connecting gate electrodes formed on an element isolation oxide film has no difference in level. It is the second object of the present invention to provide a semiconductor device having a stable fuse box which is formed on an element isolation oxide film and in which insulating breakdown does not occur in a wiring gate electrode of a fuse member.

In accordance with one aspect of the present invention, there is provided a semiconductor device with a fuse box that includes at least two gate electrodes and a fuse member. The two gate electrodes are formed on at least one insulating film on a semiconductor substrate. The fuse member is formed on the insulating film on the semiconductor substrate. Therefore, the two gate electrodes are electrically connected to each other by the fuse member. In addition, the insulating film and a field region are constituted by a semiconductor region. They are arranged adjacent to each other in a frame-like guard ring, which is constituted by a semiconductor region that is formed on the semiconductor substrate.

In another aspect of the present invention, there is provided a semiconductor device with a fuse box that includes at least two gate electrodes and a fuse member. The two gate electrodes are formed on at least one insulating film in a frame-like guard ring, which is constituted by a semiconductor region formed on a semiconductor. The fuse member is formed on the insulating film on the semiconductor substrate. The two gate electrodes are electrically connected to each other by the fuse member. In addition, the gate electrode is electrically connected to the outside through a connection unit arranged across the upper portion of the guard ring.

In a further aspect of the present invention, the field region is constituted by a semiconductor region formed on the semiconductor a substrate and the insulating film are arranged adjacent to each other in the fuse box.

In another aspect of the present invention, a plurality of columns in each of which the field region and the insulating film are adjacent to each other are arranged in the fuse box.

In a yet further aspect of the present invention, the two gate electrodes formed on the insulating film are electrically connected to each other, through perpendicular connection units formed on the gate electrodes in an upwardly perpendicular direction, by the fuse member extending in the horizontal direction between the end portions of the perpendicular connection units.

In a yet further aspect of the present invention, the perpendicular connection unit includes a connection unit arranged across the upper portion of the guard ring.

The present invention also provides a method of manufacturing a semiconductor device with a fuse box. The process includes the following steps.

S1: forming a mask film on a semiconductor substrate;

S2: forming a resist pattern on the semiconductor substrate;

S3: etching the semiconductor substrate to form a field region constituted by a semiconductor region;

S4: removing the resist pattern;

S5: etching the semiconductor substrate by using the mask film to form a trench;

S6: burying the trench with an insulating film;

S7: flattening the insulating film;

S8: forming a gate electrode on the insulating film; and

S9: arranging a fuse member for electrically connecting the gate electrode.

Then the resist pattern is constituted by a pattern in which the trench and the field region are arranged adjacent to each other on the semiconductor substrate by the step of etching the semiconductor substrate such that the field region is formed.

In another aspect of the present invention, the gate electrode is formed on the inside of a guard ring serving as an outer edge portion of the fuse box in the step of forming the gate electrode. In addition, a connection unit, which is connected between the electrode and the fuse member, is formed across the upper portion of the guard ring to connect to the outside in the step of arranging the fuse member.

In a yet further aspect of the present invention, the resist pattern includes a plurality of columns of patterns in each of which the trench and the field region are arranged adjacent to each other on the semiconductor substrate by the step of etching the semiconductor substrate such that the field region is formed.

According to the semiconductor device with the fuse box of the present invention, a field region constituted by a semiconductor region and an insulating film are arranged adjacent to each other on a semiconductor substrate. In this manner, a large area of the fuse box is divided by the field regions to decrease the area of an insulating film of one section, so that a dishing on the insulating film can be suppressed. For this reason, since fuse members laid out on the insulating films have no difference in level, the fuse members can be reliably blown by a laser beam.

According to the semiconductor device with the fuse box according to the present invention, a gate electrode is formed on the insulating film inside a guard ring of the fuse box. An electric connection to the outside is performed by a connection unit arranged across the upper portion of the guard ring. More specifically, since the gate electrode is not arranged on the guard ring, but is arranged on the insulating film, insulating breakdown does not occur in the gate electrode. In addition, since the gate electrode is not directly connected to the guard ring, but is electrically connected to the outside through a connection unit arranged across the upper portion of the guard ring. Therefore, insulating breakdown in the gate electrode can be prevented.

According to the semiconductor device with the fuse box of the present invention, a large area of the fuse box is divided by field regions to decrease the one area of an insulating film, so that a dishing on the insulating film can be suppressed.

According to the semiconductor device with the fuse box of the present invention, since the fuse box includes a plurality of columns in which field regions and insulating films are adjacent to each other, the fuse members of the plurality of columns can be arranged. In this manner, the wiring in the fuse box can be simplified, and the area of the fuse box can be reduced. For this reason, the occupancy of the chip in the fuse box can be reduced.

According to the semiconductor device with the fuse box of the present invention, the gate electrodes are not directly connected to each other by the fuse members in the fuse box. As a connection from a gate electrode to a fuse member, a perpendicular connection unit is arranged in an upwardly perpendicular direction. The fuse member for connecting the perpendicular connection units extends in the horizontal direction between the perpendicular connection units. For this reason, humidity inserted from traces generated after the fuse members are blown by a laser beam does not easily reach the gate electrode. With the three-dimensional structure, wiring corrosion after the laser beam blows the fuse members can be prevented.

According to the semiconductor device with the fuse box of the present invention, since a perpendicular connection unit includes a connection unit arranged across the upper portion of the guard ring, the configuration for electric connection can be easily achieved.

According to the method of manufacturing the semiconductor device with the fuse box of the present invention, a resist pattern is used at the step of etching the semiconductor substrate. At the etching step, the arrangement of the field regions constituted by a semiconductor substrate and the insulating film, that are adjacent to each other on the semiconductor substrate, is performed by the resist pattern. In this manner, a large area of the fuse box is divided by the field regions to decrease the area of an insulating film of one section, so that a dishing generated on the insulating film can be suppressed. For this reason, since fuse members laid out on the insulating films have no difference in level, the fuse members can be reliably blown by a laser beam.

According to the method of manufacturing the semiconductor device with the fuse box of the present invention, a gate electrode is formed on an insulating film inside a guard ring of the fuse box. An electric connection to the outside is performed by a connection unit arranged across the upper portion of the guard ring. More specifically, since the gate electrode is not arranged on the guard ring, but is arranged on the insulating film, insulating breakdown does not occur in the gate electrode. In addition, since the gate electrode is not directly connected to the guard ring, but is connected to the outside through a connection unit arranged across the upper portion of the guard ring, insulating breakdown in the gate electrode can be prevented from occurring.

According to the method of manufacturing the semiconductor device with the fuse box of the present invention, a large area of the fuse box is divided by field regions to decrease the area of one insulating film, so that a dishing on the insulating film can be suppressed.

According to the method of manufacturing the semiconductor device with the fuse box of the present invention, a resist pattern is used in the step of etching the semiconductor substrate. The resist pattern includes a plurality of patterns. At the etching step, the arrangement of the field region constituted by a semiconductor region and the insulating film, that are adjacent to each other on the semiconductor substrate, is performed by the patterns. In this manner, the wiring in the fuse box can be simplified, and the area of the fuse box can be reduced. For this reason, the occupancy of the chip in the fuse box can be reduced.

DESCRIPTION OF THE PREFERRED EMBODIMENTS

A semiconductor device with a fuse box according to the first embodiment of the present invention, a field region constituted by a semiconductor region and an insulating film are arranged adjacent to each other on a semiconductor substrate. More specifically, a large area of the fuse box is divided into field regions to decrease one area of an insulating film, so that a dishing on the insulating film can be suppressed. For this reason, since the fuse members laid out on the insulating film have no difference in level, the fuse members can be reliably blown by a laser beam.

In the second embodiment, a gate electrode is formed on an insulating film that is inside of the guard ring of a fuse box. An electric connection to the outside is performed by a contact, which is across the upper portion of the guard ring. More specifically, since the gate electrode is not arranged on the guard ring, but is arranged on the insulating film, insulating breakdown does not occur in the gate electrode. In addition, since the gate electrode is not directly connected to the guard ring, but is electrically connected to the outside through a connection unit arranged across the upper portion of the guard ring, insulating breakdown does not occur. Therefore, insulating breakdown in the gate electrode can be prevented from occurring.

In a semiconductor device according to the first embodiment of the present invention, a rectangular field region 2 and a rectangular oxide film 13 are adjacent to each other in a fuse box, the long sides of the strips are arrayed in parallel. For this reason, the one area of the rectangular oxide film 13 is small, and is flattened without generating a dishing. In this manner, fuse members 6 laid out on the gate electrode on the oxide film 13 have no difference in level. Therefore, the fuse members 6 can be reliably blown by a laser beam. In addition, since no dishing is generated in the oxide film 13, the oxide film 13 does not fall at the boundary portion between a guard ring 1 and the oxide film 13. For this reason, the field region 2 under a gate oxide film 7 is not exposed at the edge portion. Therefore, the thickness of the gate oxide film 7 is almost constant, the dielectric strength of the gate oxide film 7 does not decrease at the end portion.

In the fuse box of the semiconductor device, gate electrodes 9 and the fuse members 6 are connected to each other by a three-dimensional structure. Therefore, the gate electrodes 9 are not directly connected to each other by the fuse members 6. More specifically, a perpendicular connection unit constituted by a bit line contact 10, a bit line 4, and a contact 5 is arranged in an upwardly perpendicular direction from the gate electrodes 9. The fuse members 6 for connecting the two contacts 5 are extended in a horizontal direction. Since the gate electrodes 9 and the fuse members 6 are connected by the three-dimensional structure as described above, after the fuse members are blown by the laser beam, humidity inserted from traces generated can hardly reach the gate electrodes 9. After the laser beam blows the fuse members, with this structure, wiring corrosion can be prevented.

Figure 1:
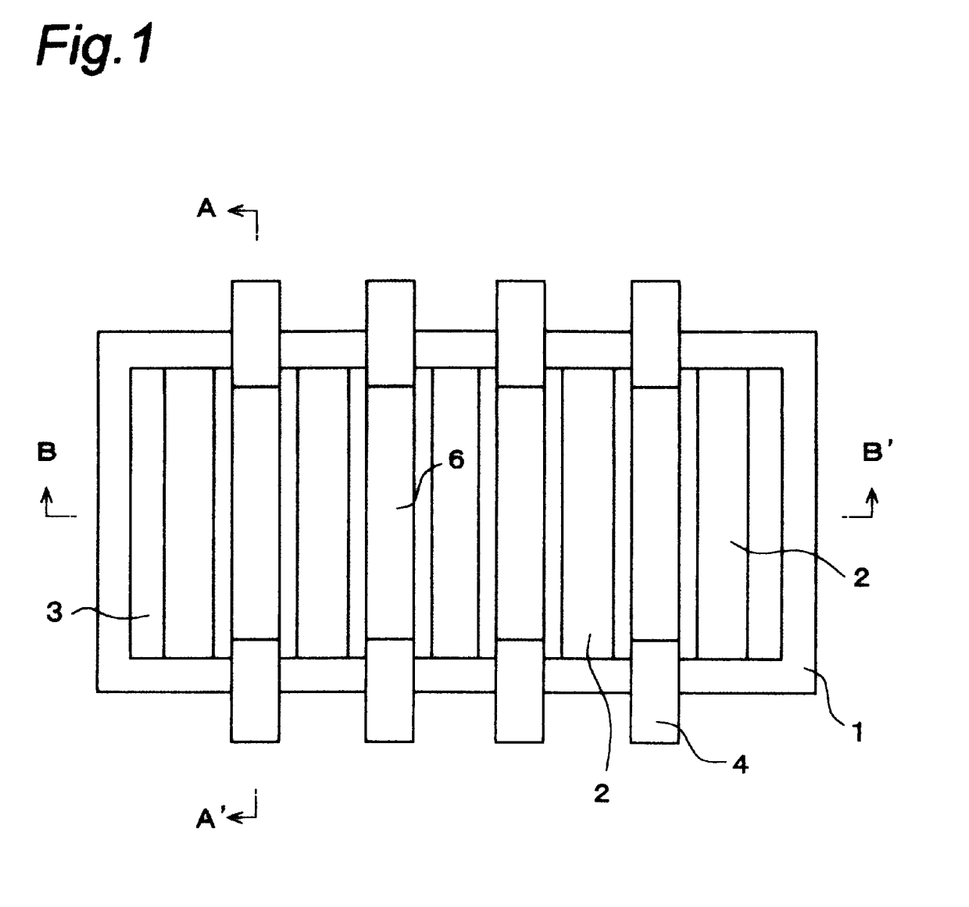
FIG. 1 is an upper view of a fuse box in a semiconductor device according to the first embodiment of the present invention.

FIG. 1 is an upper view of a fuse box of a semiconductor device according to the first embodiment of the present invention. The fuse box in the semiconductor device is surrounded by the guard ring 1 constituted by a semiconductor region. In the guard ring 1, as is apparent from the upper view of FIG. 1 and a sectional view of FIG. 3, the rectangular field regions 2 constituted by semiconductor regions and the rectangular oxide films 13 are arranged on a semiconductor substrate 100 such that the long sides of the field region 2 and the long sides of the oxide films 13 are adjacent to each other.

The arrangement of the field regions 2 constituted by the semiconductor regions and the oxide films 13 on the semiconductor substrate 100 is not limited to an alignment in which rectangular shapes are arranged in parallel. The area of one section of the oxide films 13 is smaller than the area of the entire fuse box in the arrangement, its arrangement may be used. Therefore, for example, the oxide films 13 are continued as a whole, and the oxide films 13 may be divided into a plurality of sections by the field regions 2. The shape of the insulating film 13 is not limited to a rectangular shape. The oxide film 13 may employ any shape in which the gate electrodes 8 and 9 can be formed.

The fuse box in the semiconductor device has a plurality of fuse member for electrically connecting the gate electrodes 9 to each other on the oxide films 13 in the guard ring 1. One fuse member 6 electrically connects two gate electrodes 9 formed on the oxide films 13. More specifically, each of the gate electrodes 9 and the fuse member 6 are not directly connected to each other, the gate electrode 9 and the fuse member 6 are connected by a structure which is three-dimensionally developed. That is, a perpendicular connection unit in which the bit line contact 10, the bit line 4, and the contact 5 are arranged in this order is arranged in an upwardly perpendicular direction on the gate electrode 9. In addition, the fuse members 6 for electrically connecting the contacts 5 are extended in the horizontal direction between the contacts 5. Therefore, the structure extending from the gate electrode 9 to the contact 5 is a perpendicular structure, and the fuse member 6 for electrically connecting the contacts 5 is extended in the horizontal direction, so that the connection unit is entirely constituted by a three-dimensionally developed structure.

Figure 4:
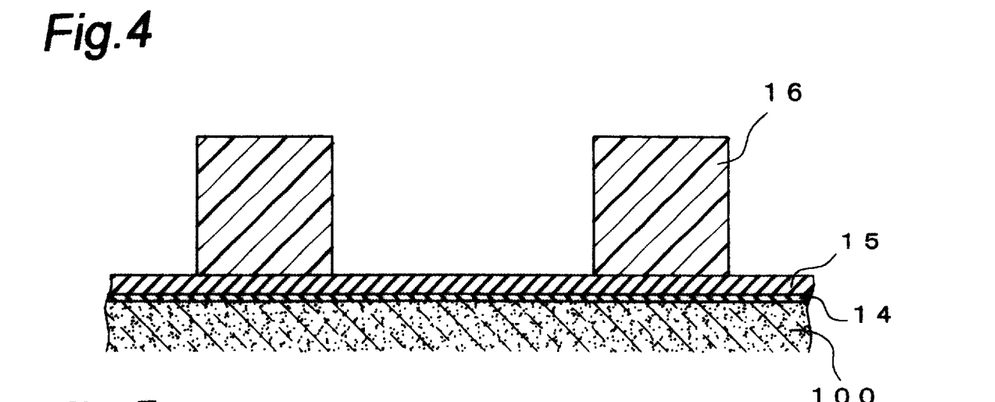
FIG. 4 is a sectional view showing the step of stacking an oxide film and a nitride film on a semiconductor substrate in this order to form a resist pattern on the resultant structure in a method of manufacturing a semiconductor device according to the first embodiment of the present invention.
Figure 5:
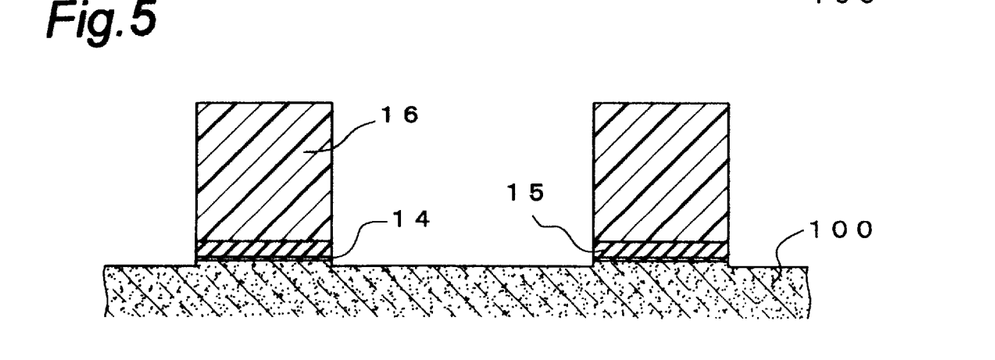
FIG. 5 is a sectional view in which a resist pattern is formed and the semiconductor substrate is etched in the method of manufacturing the semiconductor device according to the first embodiment of the present invention.
Figure 6:
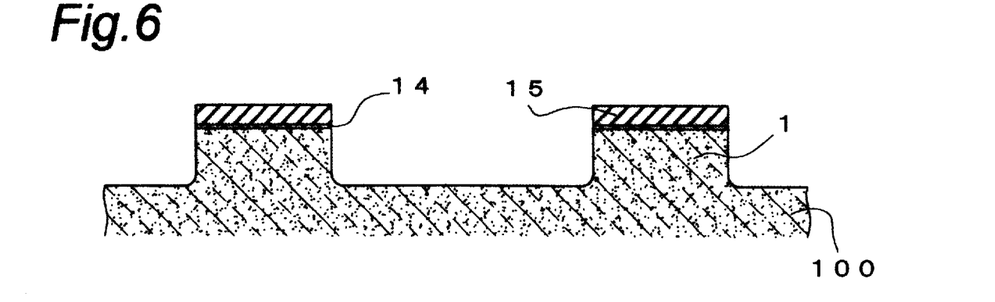
FIG. 6 is a sectional view in which the resist is removed and the semiconductor substrate is etched to form a trench in the method of manufacturing the semiconductor device according to the first embodiment of the present invention.

A method of manufacturing the semiconductor device with a fuse box will be described with reference to the accompanying drawings as follows. A pad oxide film 14 is formed on a silicon substrate 100 serving as a semiconductor substrate by a CVD (Chemical Vapor Deposition) method. The oxide film 14 may be formed by not only the CVD method but also a thermal oxidation method. A silicon nitride film 15 serving as a mask film for forming a field pattern is formed by the CVD method (FIG. 4). In addition, a resist pattern 16 for a field pattern is formed by a lithography method, and the field pattern is formed by dry etching using the resist pattern 16 as a mask (FIG. 5). After the resist pattern 16 is removed by ashing, the silicon substrate 100 is subjected to dry etching by using, as the mask film, the silicon nitride film 15 patterned into a field pattern to form a trench (FIG. 6).

After the trench is formed, the silicon substrate may be subjected to a thermal oxidation process to recover the damage to the silicon substrate caused by the dry etching. In addition, after the thermal oxidation process, the surface of the silicon substrate is nitrated, or a nitride film having a thickness of about 20 nm or less is formed on the surface of the silicon substrate, so that a stress caused by the following oxidation process may be moderated.

Figure 7:
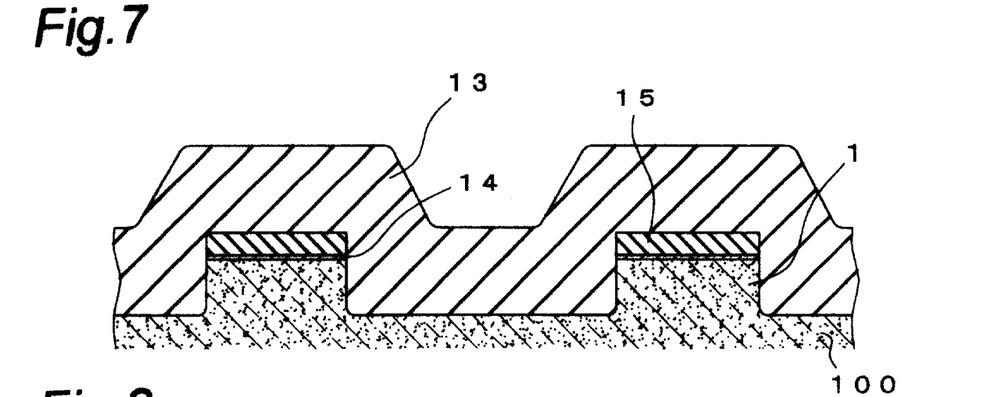
FIG. 7 is a sectional view in which an oxide film is buried in a trench in the method of manufacturing the semiconductor device according to the first embodiment of the present invention.
Figure 8:
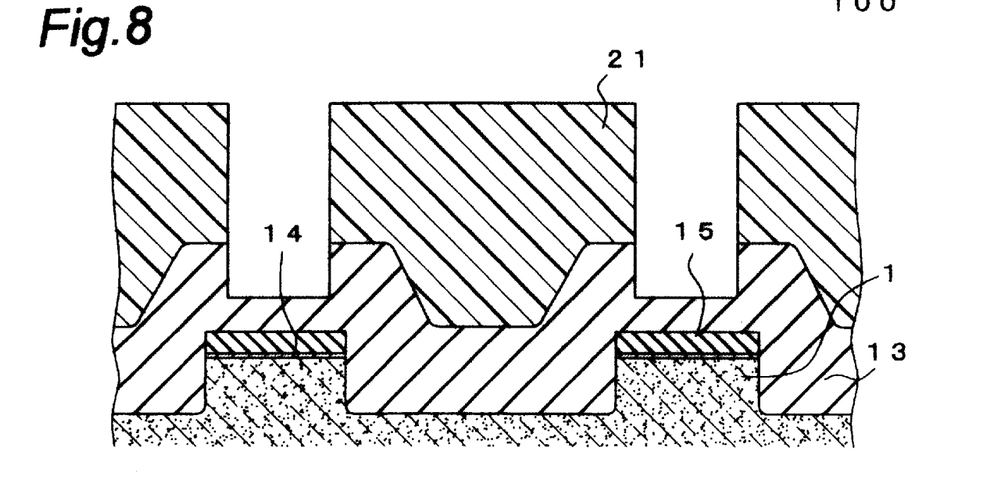
FIG. 8 is a sectional view in which a resist pattern is formed, and the oxide film is partially etched in the method of manufacturing a semiconductor device according to the first embodiment of the present invention.
Figure 9:
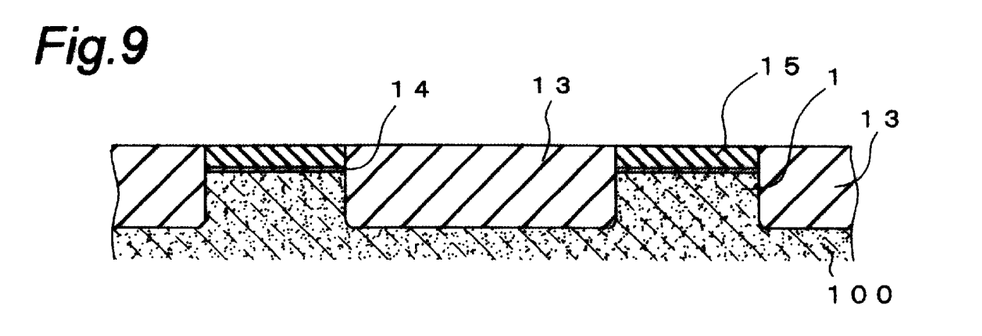
FIG. 9 is a sectional view in which the oxide film is flattened to expose the nitride film in the method of manufacturing the semiconductor device according to the first embodiment of the present invention.
Figure 10:
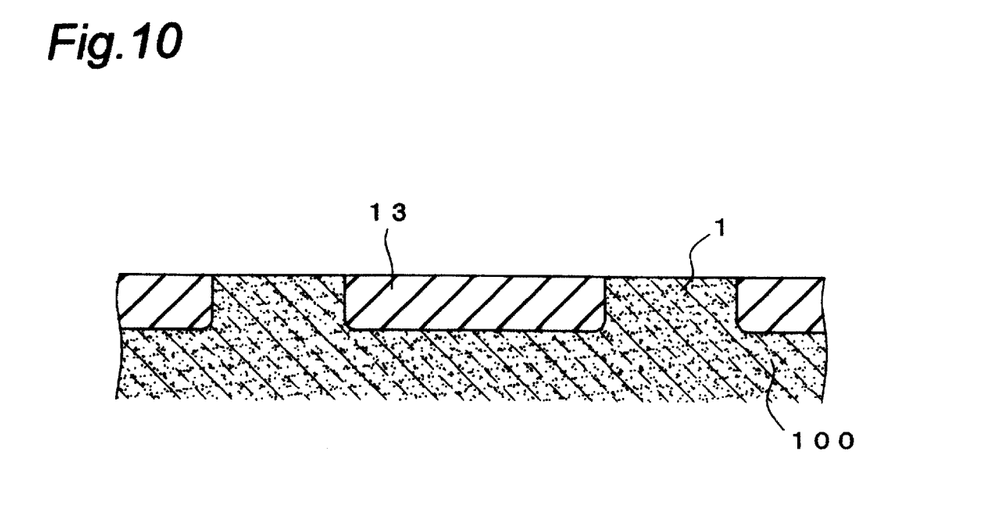
FIG. 10 is a sectional view in which the nitride film and the oxide film are removed to expose the semiconductor region in the method of manufacturing the semiconductor device according to the first embodiment of the present invention.

An oxide film 13 is deposited on the silicon substrate by a HDP (High Density Plasma) CVD method (FIG. 7). In this manner, the trenches formed on the silicon substrate 100 is buried with the oxide film 13. A resist pattern 21 is formed, and the field pattern is partially subjected to dry etching by using the resist pattern as a mask (FIG. 8). In addition, the oxide film 13 is polished by a CMP (Chemical Mechanical Polishing) method. The resultant structure is flattened such that the surface of the silicon nitride film 15 patterned into a field pattern is exposed (FIG. 9). Thereafter, the silicon nitride film 15, the oxide film 13, and the pad oxide film 14 are selectively etched in this order, so that the silicon nitride film 15 and the pad oxide film 14 are removed (FIG. 10).

Figure 3:
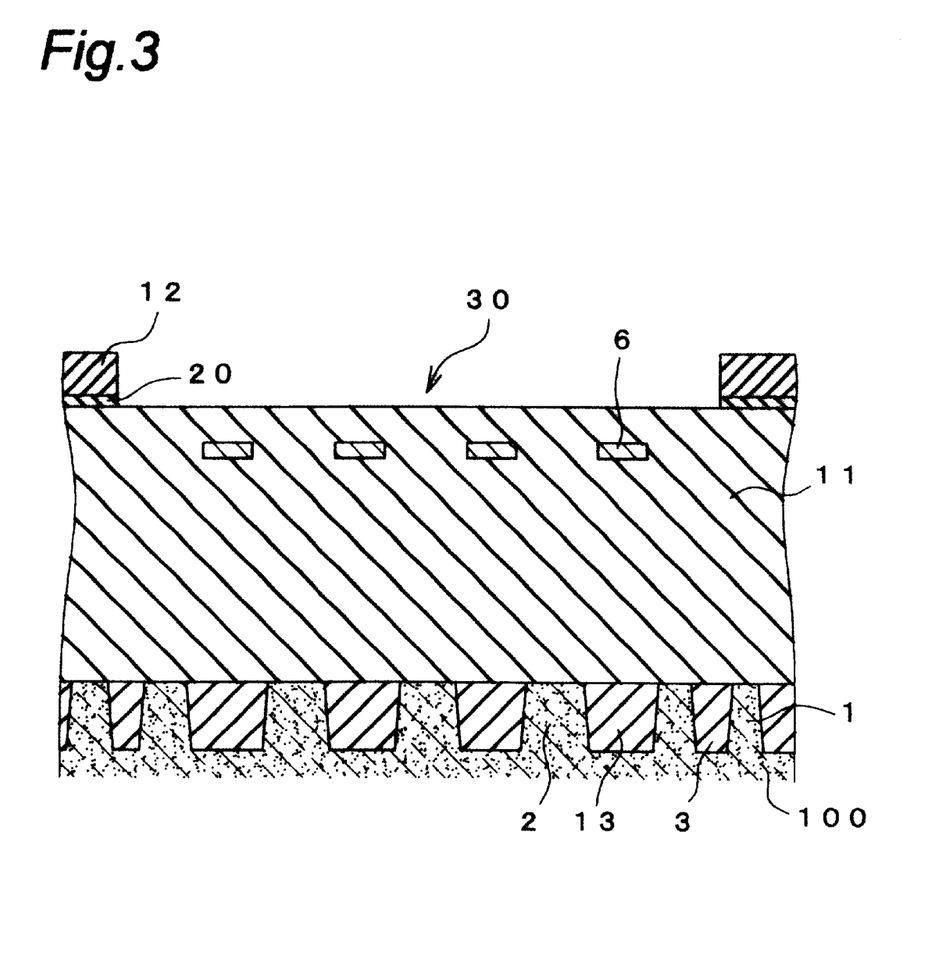
FIG. 3 is a sectional view along a B–B' line in FIG. 1.

At this time, on the silicon substrate 100, as shown in the upper view of FIG. 1 and the sectional view of FIG. 3, field regions 2 constituted by rectangular semiconductor regions and the oxide films 13 serving as rectangular insulating films are arranged adjacent to each other in the guard ring 1 constituted by a semiconductor region. More specifically, in the fuse box, an entire large isolation pattern is not used as an oxide film, but the oxide film is divided into the regions of the plurality of rectangular oxide films 13 by the plurality of field regions 2. As above, reducing the area of one oxide film 13 suppresses dishing on the oxide films 13, as shown in FIG. 10.

The resist pattern 16 makes arrangement of the field regions 2 and the oxide films 13. Fuse members are arranged on the oxide films 13 by the steps (to be described later). The resist pattern 16 having a predetermined pattern, which is desired to arrange the fuse members, can be formed. In this case, the area of the field regions 2 in the guard ring 1 preferably ranges from 15% to 60%.

Figure 11:
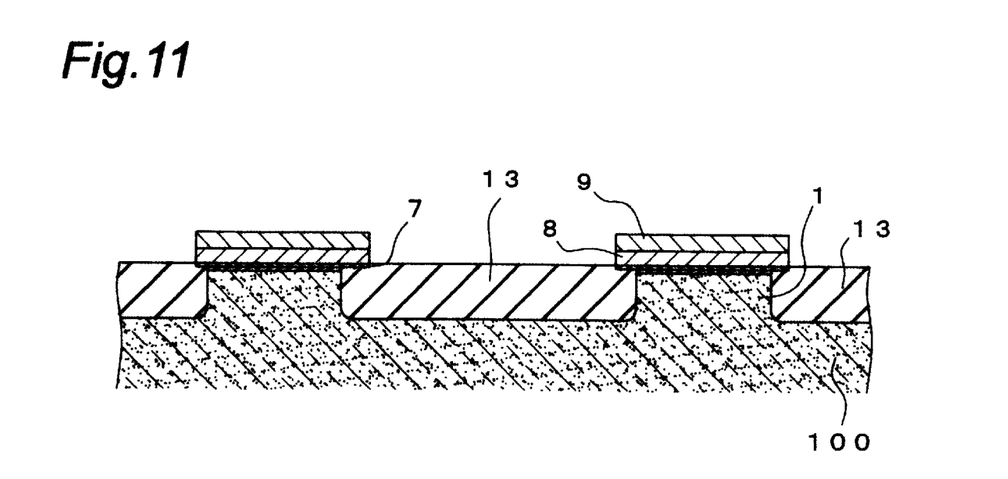
FIG. 11 is a sectional view in which the gate electrode is formed across the guard ring and the oxide film in the method of manufacturing the semiconductor device according to the first embodiment of the present invention.

Furthermore, a method of arranging the fuse members 6 in the fuse box will be described below. A gate oxide film 7 is formed over the guard ring 1 constituted by the semiconductor region and the oxide films 13. A gate electrode (to be referred to as a gate electrode 9 by using the above reference numeral hereinafter) constituted by a laminate wiring layer consisting of polysilicon 8 and tungsten silicide 9 is formed on the gate oxide film 7 (FIG. 11). A bit line contact 10 consisting of tungsten is formed on the gate electrode 9 to connect a bit line 4 consisting of tungsten and the gate electrode 9 to each other. The material of the bit line contact 10 is not limited to tungsten. The bit line contact 10 may consist of polysilicon or the like. A contact 5 consisting of tungsten is formed on the bit line 4, and the contacts 5 are connected to each other by a fuse member 6 consisting of an Al—Cu alloy.

As the material of the fuse member 6, a material which can be cut by a laser beam, for example, copper, simple tungsten, AlCu, AlSiCu, a laminate structure consisting of at least one of group of copper, tungsten, titanium and TiN, or the like can be used.

Figure 2:
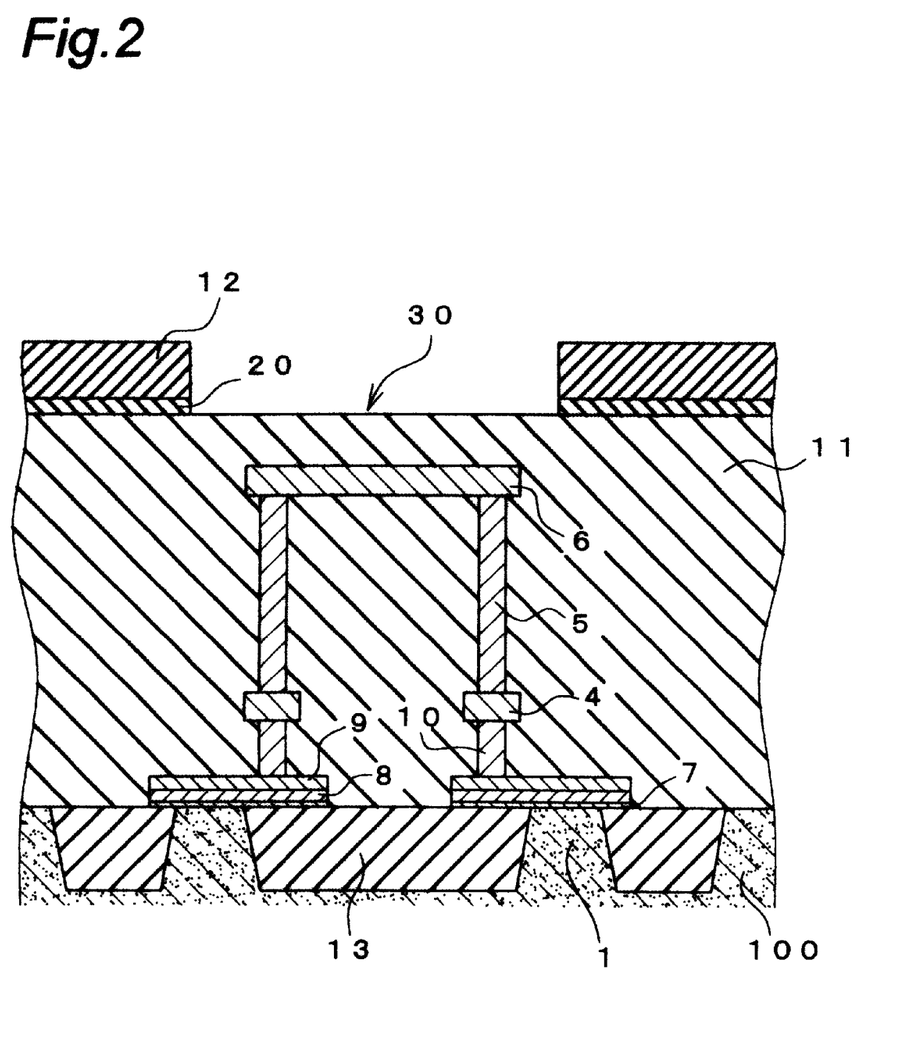
FIG. 2 is a sectional view along an A–A' line in FIG. 1.

In addition, the fuse member 6 is covered with an oxide film 11 stacked on the element isolation oxide films 13. The material of the insulating film 11 may employs TEOS, BPTEOS, FSG, or the like. A nitride film 20 and a photosensitive polyimide layer 12 are stacked in this order. Thereafter, an opening 30 is formed in the nitride film 20 and the photosensitive polyimide layer 12 by dry etching so that the fuse members 6 can be blown by a laser beam (FIG. 2). In this manner, the fuse box is formed.

The fuse member 6 is blown by a laser beam through the opening 30. The fuse member 6 and the upper oxide film 11 which are irradiated with the laser beam sharply thermally expand to cut the fuse members 6.

Figure 12:
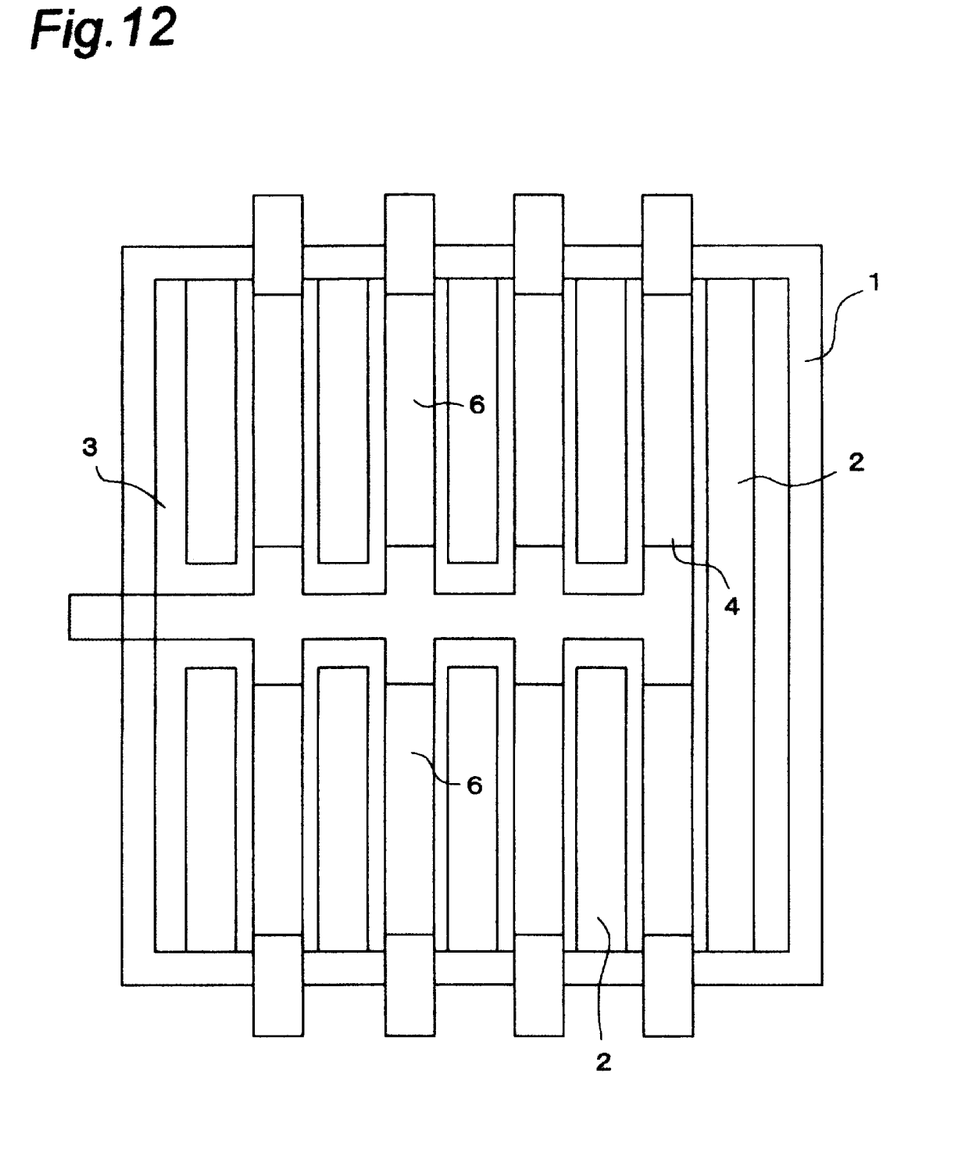
FIG. 12 is an upper view of the fuse box in the semiconductor device according to the second embodiment of the present invention.

A fuse box of a semiconductor device according to the second embodiment of the present invention has two columns in which the field regions 2 constituted by semiconductor regions and the oxide films 13 are adjacent to each other on a semiconductor substrate in the fuse box. As described above, the large isolation pattern is not divided by one oxide film, but is divided by the field regions 2 into the plurality of small oxide films 13, so that a dishing on the oxide films 13 is prevented. In this manner, initial defective dielectric strength of the gate insulating film 7 between the gate electrode and the guard ring 1 constituted by a semiconductor region is prevented, and a semiconductor device having high reliability can be provided.

The fuse members are arranged on the oxide films, respectively. More specifically, fuse members of two columns are arranged in the fuse box. In this manner, since the fuse members of the plurality of columns can be arranged in the fuse box to bind the wires, an area occupied by the fuse box can be reduced. For this reason, the area occupied by the fuse box in the entire chip can be reduced. The fuse box is suitable for chip shrinkage.

FIG. 12 is an upper view of a fuse box of a semiconductor device according to the second embodiment of the present invention. When the fuse box in the semiconductor device is compared with the fuse box in the semiconductor device according to the first embodiment, these fuse boxes are different from each other in that two columns in which the field regions 2 and the oxide films 13 are adjacent to each other on the a semiconductor substrate are arranged.

The fuse box in the semiconductor device has a plurality of fuse members constituted by two columns. In this fuse box, in a perpendicular connection unit which is a wiring to the fuse members 6, one ends of the bit lines 4 are concentratedly electrically connected to the ground or Vcc, so that the wiring can be simplified. In this manner, a wiring area in the fuse box can be reduced, and the occupancy of the fuse box can be reduced.

In the guard ring, a ratio of the area of the field regions 2 to the total area of the field regions 2 constituted by the semiconductor regions and the oxide films 13 on the silicon substrate 100 preferably ranges 15% to 60%.

Figure 13:
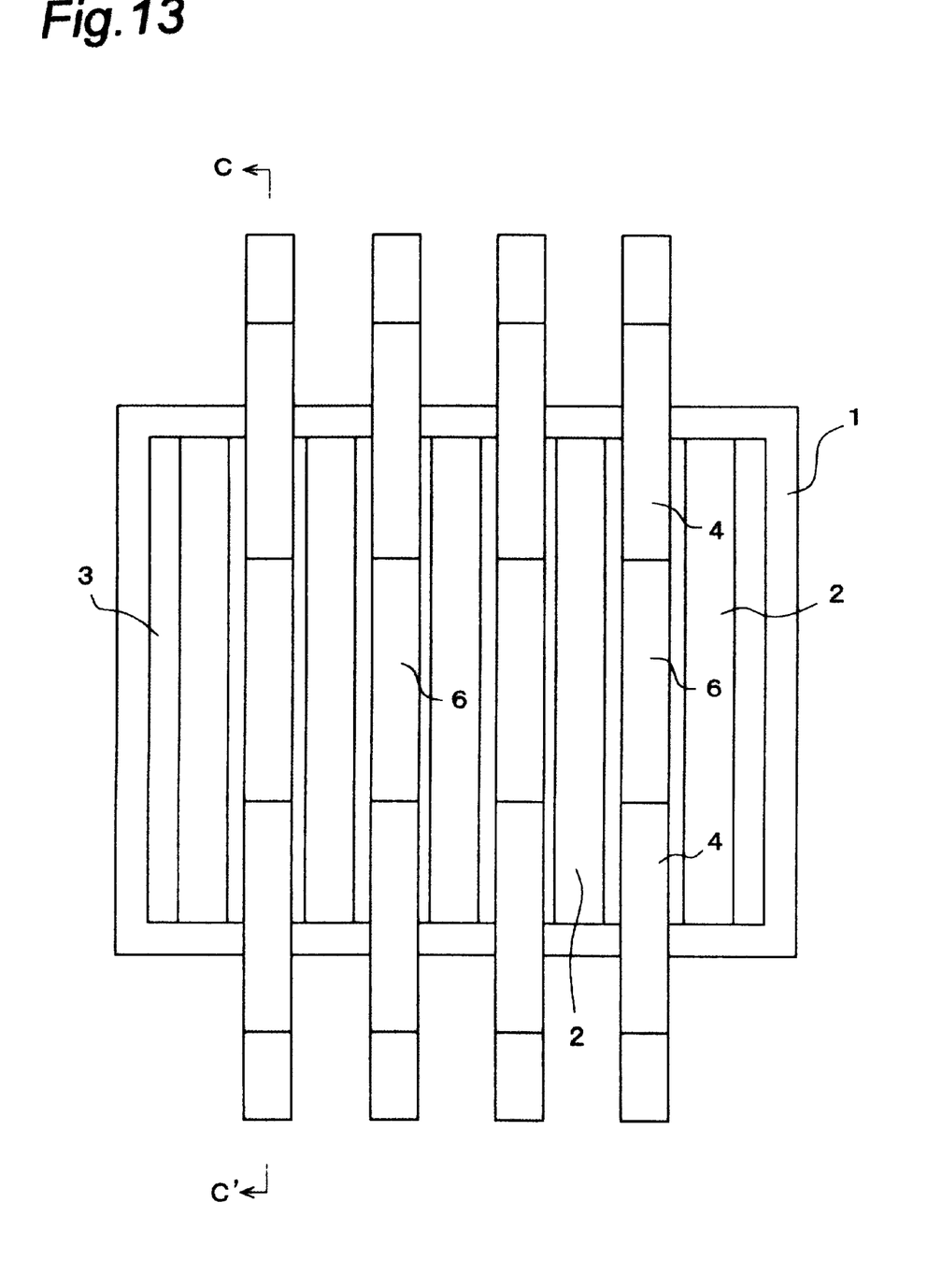
FIG. 13 is an upper view of the fuse box in the semiconductor device according to the third embodiment of the present invention.

In a fuse box of a semiconductor device according to the third embodiment of the present invention, a gate electrode is formed on an oxide film inside the guard ring of the fuse box. In this manner, whether a semiconductor region constituting the guard ring is exposed or not at the end portion between the guard ring and the oxide film, insulating breakdown of the gate electrode formed on the oxide film does not occur. In addition, an electric connection to the outside is performed through a bit line formed across the upper portion of the guard ring. Therefore, even in the connection to the outside, the bit contact is not in direct contact with the guard ring, so that insulating breakdown does not occur.

FIG. 13 is an upper view of a fuse box of the semiconductor device. The fuse box of the semiconductor device differs from the fuse box of the semiconductor device according to the first embodiment, on which the gate electrodes 8 and 9 are arranged on the oxide films 13 inside a guard ring 1, not arranged on the guard ring 1. In addition, the fuse box of the semiconductor device differs from the fuse box of the semiconductor device according to the first embodiment, on which an electric connection to the outside is performed through a bit line 4 arranged across the upper portion of the guard ring 1.

Figure 14:
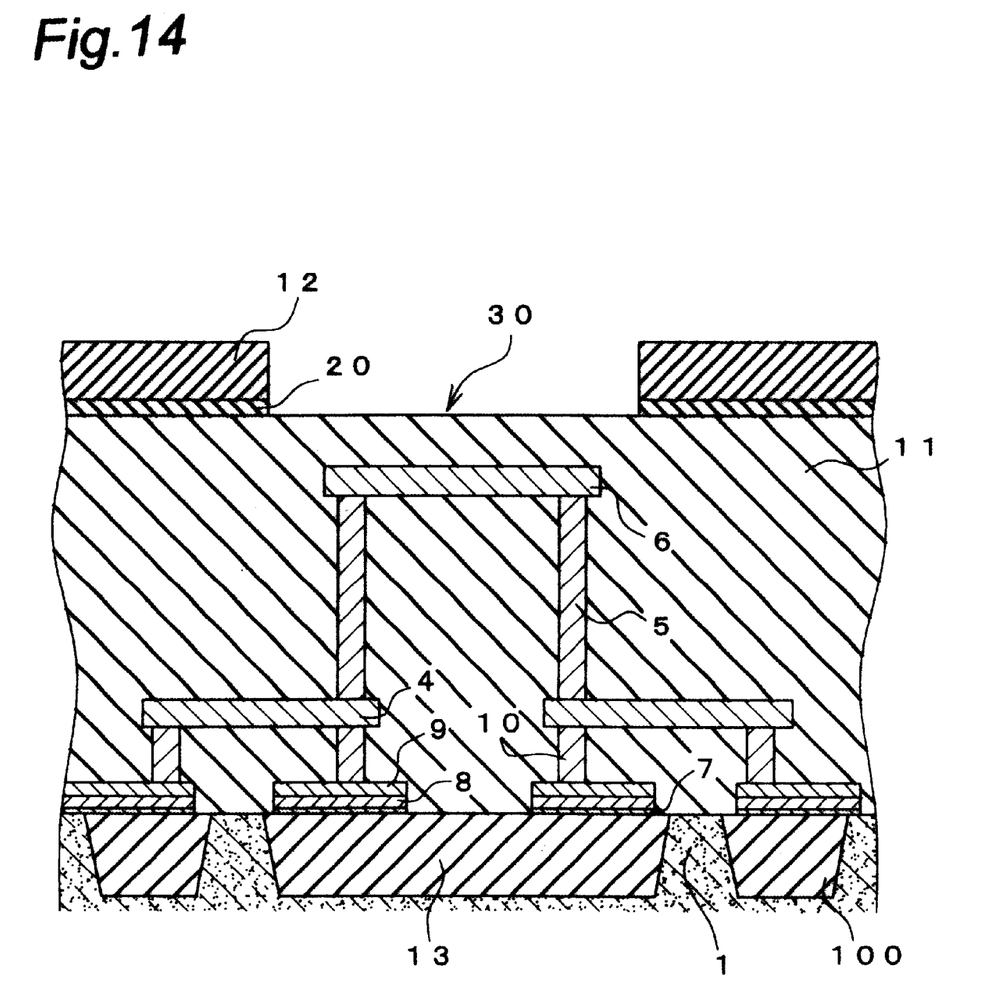
FIG. 14 is a sectional view along a C–C' line in FIG. 13.

The fuse box in the semiconductor device includes a plurality of fuse members. The fuse members and the gate electrodes are electrically connected by a perpendicular connection unit constituted by a three-dimensional structure on the gate electrode 9. More specifically, two gate electrodes 9 formed on the oxide films 13 in the guard ring 1, as shown in the sectional view of FIG. 14, are electrically connected by the fuse members 6 extending in the horizontal direction between the perpendicular connection units formed on the gate electrodes 9 in the upwardly perpendicular direction. The gate electrodes 8 and 9 are not arranged on the guard ring 1 unlike the gate electrodes 8 and 9 in the fuse box of the first embodiment. For this reason, the electric connection of the gate electrodes 9 to the outside are performed through the bit line 4 arranged across the upper portion of the guard ring 1.

Although the fuse member 6 is electrically connected to the outside through the bit line 4, the connection to the outside is not limited to this structure. The electric connection to the outside is temporarily guided onto the gate electrode 9, and a connection to the fuse members 6 may be performed in the same manner as that in the first embodiment.

In this manner, since the gate electrodes are formed on the oxide films 13 in the guard ring 1, insulating breakdown of the gate electrodes 9 does not occur, whether the edge portion of the guard ring is exposed or not caused by a dishing in the oxide films 13. Therefore, initial defective dielectric strength of the gate insulating film 7 between the gate electrode 9 and the guard ring 1 constituted by a semiconductor region is prevented, so that a semiconductor device having high reliability can be provided.

Figure 15:
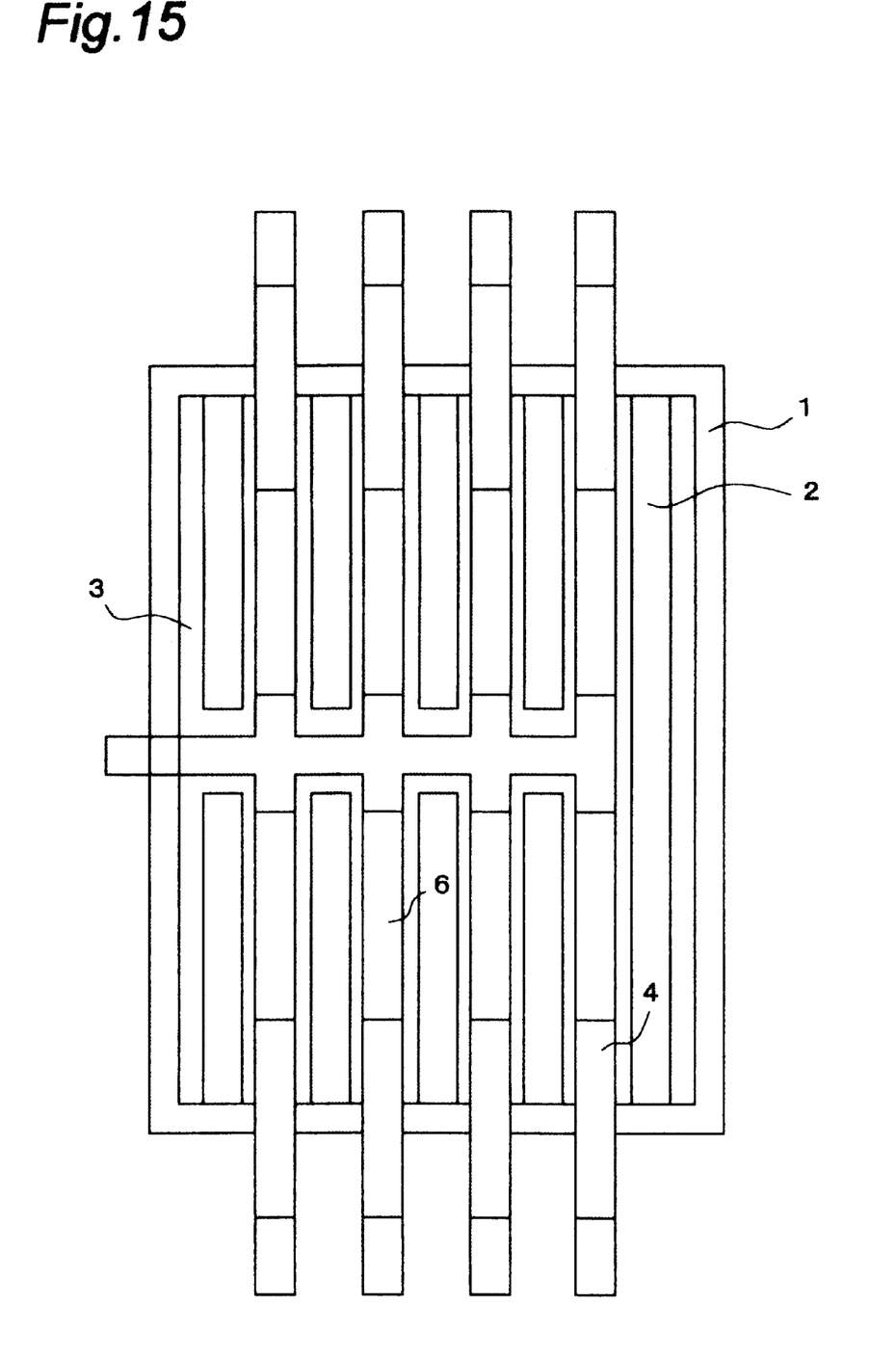
FIG. 15 is an upper view of the fuse box in the semiconductor device according to the fourth embodiment of the present invention.
Figure 16:
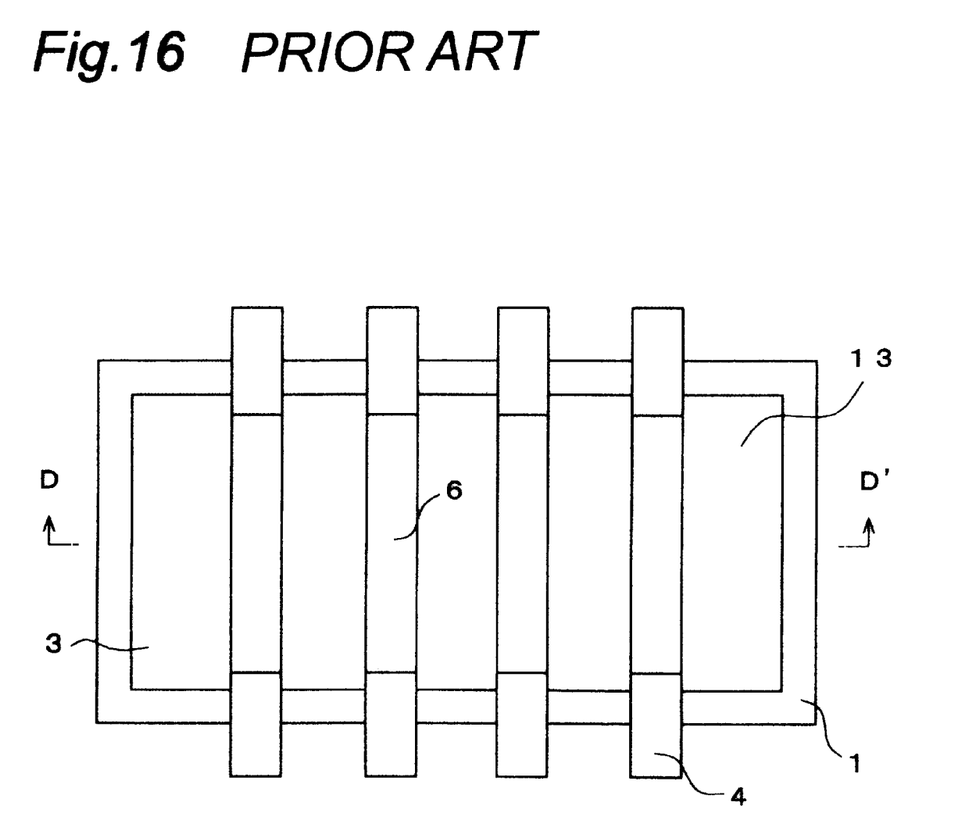
FIG. 16 is an upper view of the fuse box in the prior art semiconductor device.

In a fuse box of a semiconductor device according to the fourth embodiment of the present invention, a gate electrode is formed on an oxide film in the guard ring of the fuse box. In this manner, whether a semiconductor region constituting the guard ring is exposed or not at the end portion between the guard ring and the oxide film, insulating breakdown of the gate electrode formed on the oxide film does not occur. In addition, an electric connection to the outside is performed through a bit line formed across the upper portion of the guard ring. Therefore, even in the connection to the outside, the bit contact is not in direct contact with the guard ring, so that insulating breakdown does not occur.

In the fuse box of the semiconductor device, fuse members of two columns are formed. In this manner, since the fuse members of the plurality of columns can be arranged in the fuse box to bind the wires, an area occupied by the fuse box can be reduced. For this reason, the area occupied by the fuse box in the entire chip can be reduced. The fuse box is suitable for chip shrinkage.

FIG. 15 is an upper view of the fuse box of the semiconductor device according to the fourth embodiment of the present invention. The fuse box in the semiconductor device differs from the fuse box in the semiconductor device according to the third embodiment, on which two column of the fuse members are included.

The fuse box in the semiconductor device has a plurality of fuse members constituted by two columns. For this reason, one ends of the bit lines 4 constituting a perpendicular connection unit serving as wires to the fuse members are concentratedly electrically connected to the ground or Vcc, so that the wiring can be simplified. In this manner, a wiring area in the fuse box can be reduced, and the occupancy of the fuse box can be reduced.

What is claimed is:

1. A semiconductor device with a fuse box comprising:
   at least two gate electrodes formed on at least one insulating film on a semiconductor substrate; and,
   a fuse member, by which the two gate electrodes are electrically connected to each other, formed on the insulating film on the semiconductor substrate;
   wherein the insulating film and a field region constituted by a semiconductor region are arranged adjacent to each other in a frame-like guard ring constituted by a semiconductor region formed on the semiconductor substrate.

2. A semiconductor device according to claim 1, wherein a plurality of columns in each of which the field region and said insulating film are adjacent to each other are arranged in the fuse box.

3. A semiconductor device with a fuse box according to claim 1, wherein the two gate electrodes formed on the insulating film are electrically connected to each other, through perpendicular connection units formed on the gate electrodes in an upwardly perpendicular direction, by the fuse member extending in the horizontal direction between the end portions of the perpendicular connection units.

4. A semiconductor device with a fuse box according to claim 3, wherein the perpendicular connection unit includes a connection unit arranged across the upper portion of the guard ring.

5. A semiconductor device with a fuse box comprising:
   at least two gate electrodes formed on at least one insulating film in a frame-like guard ring constituted by a semiconductor region formed on a semiconductor; and, a fuse member, by which the two gate electrodes are electrically connected to each other, formed on the insulating film on the semiconductor substrate;

wherein the gate electrode is electrically connected to the outside through a connection unit arranged across the upper portion of the guard ring.

6. A semiconductor device according to claim 5, wherein said field region constituted by a semiconductor region formed on the semiconductor substrate and said insulating film are arranged adjacent to each other in the fuse box.

* * * * *